(12) United States Patent
Fujimoto et al.

(10) Patent No.: US 9,914,637 B2
(45) Date of Patent: Mar. 13, 2018

(54) ELECTRONIC DEVICE USING MEMS TECHNOLOGY

(71) Applicant: KABUSHIKI KAISHA TOSHIBA, Tokyo (JP)

(72) Inventors: Akira Fujimoto, Kawasaki Kanagawa (JP); Naofumi Nakamura, Tokyo (JP); Tamio Ikehashi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/250,519

(22) Filed: Aug. 29, 2016

(65) Prior Publication Data

US 2017/0267517 A1 Sep. 21, 2017

(30) Foreign Application Priority Data

Mar. 15, 2016 (JP) .................................. 2016-051228

(51) Int. Cl.
*B81B 3/00* (2006.01)
*B81C 1/00* (2006.01)

(52) U.S. Cl.
CPC ........ *B81B 3/0075* (2013.01); *B81C 1/00674* (2013.01); *B81B 2201/0221* (2013.01); *B81B 2201/0235* (2013.01); *B81B 2203/0307* (2013.01); *B81B 2203/0315* (2013.01); *B81C 2201/0123* (2013.01); *B81C 2201/0132* (2013.01); *B81C 2201/053* (2013.01)

(58) Field of Classification Search
CPC .......... B81B 3/0075; B81B 2201/0221; B81B 2201/0235; B81B 2203/0307; B81B 2203/0315; B81C 1/00674; B81C 2201/0123; B81C 2201/0132; B81C 2201/053
See application file for complete search history.

(56) References Cited

U.S. PATENT DOCUMENTS

| 8,592,998 | B2 | 11/2013 | Claes et al. |
| 8,610,224 | B2 | 12/2013 | Naito et al. |
| 2012/0013020 | A1 | 1/2012 | Guo et al. |
| 2012/0256308 | A1 | 10/2012 | Helin |
| 2014/0227816 | A1* | 8/2014 | Zhang ................. B81C 1/00333 438/48 |

FOREIGN PATENT DOCUMENTS

JP 2012218147 A 11/2012

OTHER PUBLICATIONS

"Poly-Site-Based MEMS Thin-Film Encapsulation" J.of MEMS. vol.21 No. 1. p. 110-120.

* cited by examiner

*Primary Examiner* — Tucker J Wright
(74) *Attorney, Agent, or Firm* — Patterson & Sheridan, LLP

(57) ABSTRACT

According to one embodiment, an electronic device includes a base region, an element portion located on the base region, the element portion including a movable portion, and a protective film overlying the element portion and forming a cavity on an inner side of the protective film. The protective film includes a first protective layer and a second protective layer located on the first protective layer. A hole extends in a direction parallel to a main surface of the base region, and the second protective layer covers the hole.

16 Claims, 10 Drawing Sheets

ELECTRONIC DEVICE USING MEMS TECHNOLOGY

CROSS-REFERENCE TO RELATED APPLICATION

This application is based upon and claims the benefit of priority from Japanese Patent Application No. 2016-051228, filed on Mar. 15, 2016, the entire contents of which are incorporated herein by reference.

FIELD

Embodiments described herein relate generally to an electronic device and a method of manufacturing the electronic device.

BACKGROUND

An electronic device in which a micro electro-mechanical systems (MEMS) element such as a variable capacitor is formed on a semiconductor substrate is proposed.

In the aforementioned electronic device, an element portion (MEMS element portion) including a movable portion is covered with a protective film, and a cavity is formed on an inner side of the protective film.

However, an electronic device of the related art does not always include an appropriate protective film.

DETAILED DESCRIPTION

According to an embodiment, there is provided an electronic device including an appropriate protective film and a method of manufacturing an electronic device.

In general, according to one embodiment, an electronic device includes a base region, an element portion located on the base region, the element portion including a movable portion, and a protective film overlying the element portion and forming a cavity on an inner side of the protective film facing the element region. The protective film includes a first protective layer and a second protective layer located on the first protective layer. A hole extends in a direction parallel to a main surface of the base region, and the second protective layer covers the hole.

Hereinafter, embodiments will be described with reference to the accompanying drawings.

First Embodiment

First, an electronic device according to a first embodiment will be described. The electronic device according to the present embodiment is used as a variable capacitor and is formed by using a MEMS technology. The variable capacitor is used as an acceleration sensor.

Figure 1:
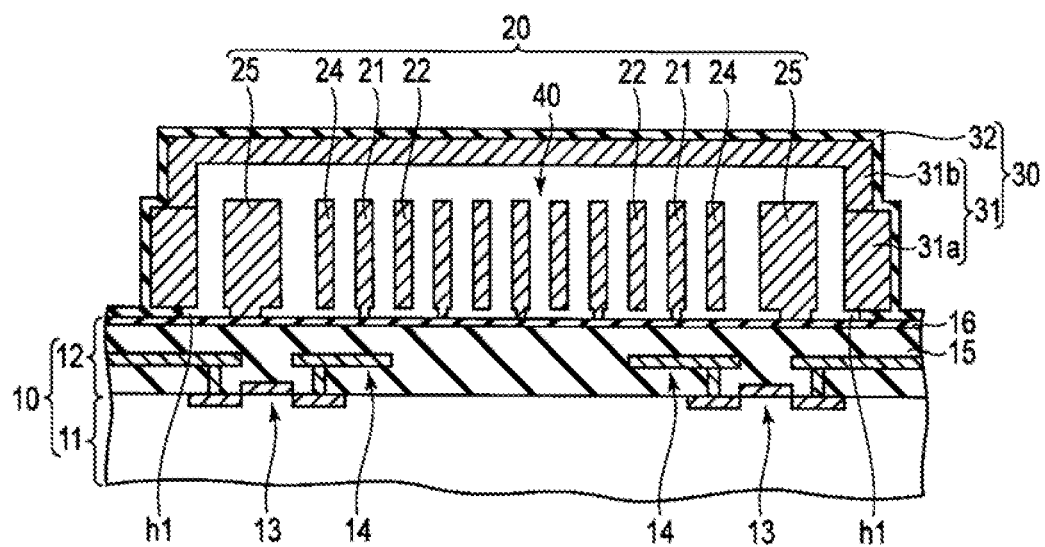
FIG. 1 is a sectional view schematically illustrating a configuration of an electronic device according to a first embodiment.
Figure 2:
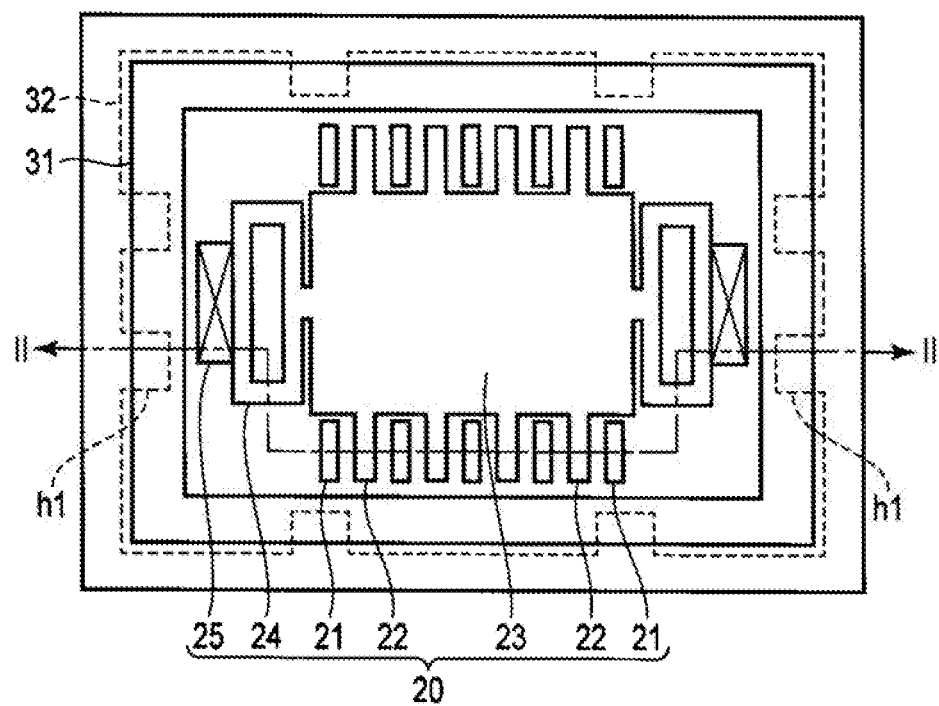
FIG. 2 is a plan view schematically illustrating the configuration of the electronic device according to the first embodiment.

FIG. 1 is a sectional view schematically illustrating a configuration of the electronic device according to the first embodiment. FIG. 2 is a plan view schematically illustrating the configuration of the electronic device according to the first embodiment. A cross section along line II-II of FIG. 2 substantially corresponds to the sectional view of FIG. 1.

As illustrated in the figures, a base region 10 includes a semiconductor substrate 11 and an insulating region 12.

MOS transistors 13 are formed in a surface region of the semiconductor substrate 11, and wires 14 are formed in the insulating region 12. That is, a circuit including the MOS transistors 13 and the wires 14 is provided in the base region 10. The circuit includes a drive circuit for driving a variable capacitor 20 which will be described below. The insulating region 12 includes an interlayer insulating film 15 and a base insulating film 16.

The variable capacitor 20 is provided on the base region 10 as an element portion including a movable portion. The variable capacitor 20 includes multiple fixed electrodes 21 and multiple movable electrodes 22 which are alternately arranged in a direction parallel to a main surface of the base region 10. All of the fixed electrodes 21 and the movable electrodes 22 have a pattern, in plan view, of a comb teeth shape, and the adjacent surfaces of the fixed electrode 21 and the movable electrode 22 adjacent to each other face each other. The fixed electrode 21 is fixed to the base region 10, and the movable electrode 22 may move in a direction (horizontal direction) parallel to the main surface of the base region 10. As the movable electrodes 22 move in the horizontal direction, a distance between the movable electrodes 22 and the fixed electrodes 21 adjacent to the movable electrodes changes, and the capacitance existing between the movable electrodes 22 and the fixed electrodes 21 adjacent to the movable electrodes changes. For example, acceleration can be obtained by detecting the change of the capacitance.

The movable electrodes 22 are connected to a mass configuration portion 23 having a large pattern area. More specifically, the movable electrodes 22 and the mass configuration portion 23 are formed as one piece. The mass configuration portion 23 is connected to a pair of spring portions 24, and the pair of spring portions 24 is connected to a pair of anchor portions 25.

The variable capacitor 20 is covered with a protective film (thin film cap) 30, and a cavity 40 is formed on the inner side of the protective film 30. The protective film 30 includes a first protective layer 31 in which multiple holes h1 are formed, and a second protective layer 32 which is provided on the first protective layer 31 and covers the holes h1.

The first protective layer 31 is formed of a material containing silicon (Si) and germanium (Ge), and includes a lower layer portion 31a and an upper layer portion 31b. Hence, both the lower layer portion 31a and the upper layer portion 31b are formed of a material containing silicon (Si) and germanium (Ge). Specifically, the first protective layer 31 (lower layer portion 31a and upper layer portion 31b) is formed of SiGe. The second protective layer 32 can be formed of, for example, a crystal-based material film, a silicon nitride film, or the like.

Each hole h1 extends in a direction parallel to the main surface of the base region 10. In addition, the inner surfaces of each hole h1 are defined by the gap between base region 10 and the first protective layer 31. That is, each hole h1 is surrounded by the base region 10 and the first protective layer 31. The aforementioned holes h1 are used to supply etching gas and to discharge the etching gas, when a sacrificial layer which will be described below is removed. A height (height in a direction perpendicular to the main surface of the base region 10, or a distance between a lower surface and an upper surface of the hole h1) of the hole h1 is in a range of from 0.05 µm to 0.5 µm, and a length (length in a direction parallel to the main surface of the base region 10) of the holes h1 is equal to or greater than 5 µm.

Next, a method of manufacturing the electronic device according to the present embodiment will be described. FIG. 3 to FIG. 9 are sectional views schematically illustrating the method of manufacturing the electronic device according to the present embodiment.

Figure 3:
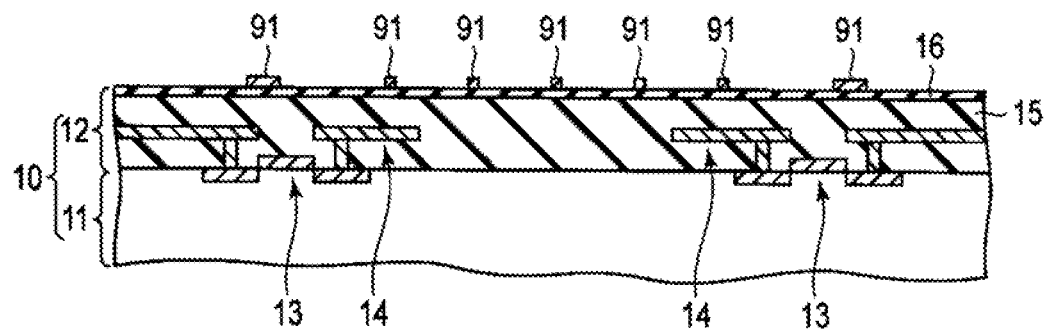
FIG. 3 is a sectional view schematically illustrating a part of a method of manufacturing the electronic device according to the first embodiment.

First, a pattern 91 of a poly-SiGe layer containing p-type impurity is formed on the base region 10, as illustrated in FIG. 3.

Figure 4:
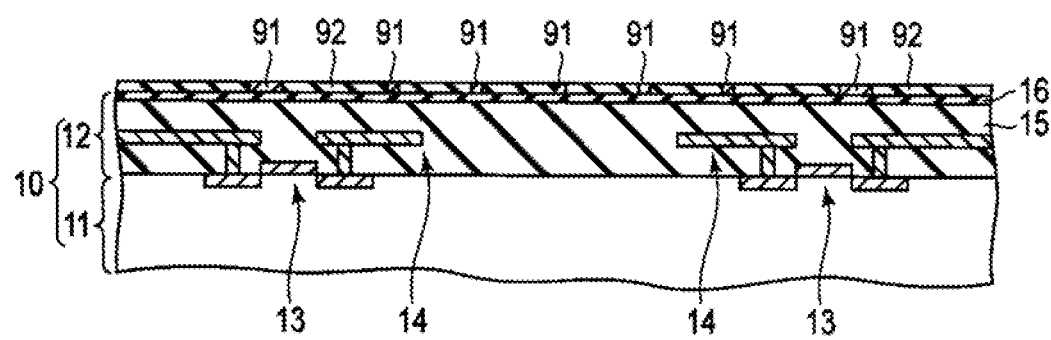
FIG. 4 is a sectional view schematically illustrating a part of the method of manufacturing the electronic device according to the first embodiment.

Subsequently, a first sacrificial layer 92 is formed on the base region 10 as illustrated in FIG. 4. Specifically, a silicon oxide film is formed on the entire surface of the insulating film 15, and thereafter the entire surface is planarized by chemical mechanical polishing (CMP). As a result, a pattern of the first sacrificial layer 92 formed by the silicon oxide film is obtained.

Figure 5:
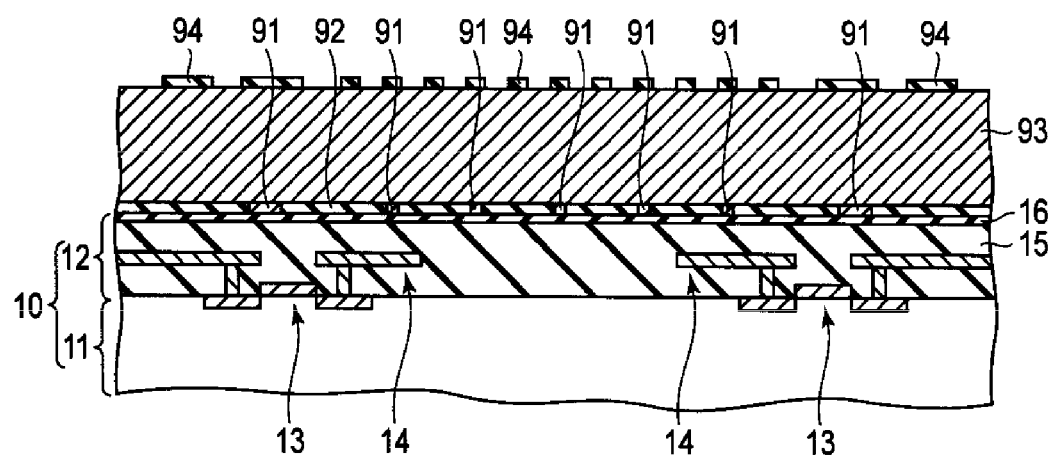
FIG. 5 is a sectional view schematically illustrating a part of the method of manufacturing the electronic device according to the first embodiment.

Subsequently, a poly-SiGe layer 93 containing a p-type impurity is formed on a poly-SiGe layer pattern 91 and the first sacrificial layer 92, as illustrated in FIG. 5. Furthermore, a silicon oxide film pattern 94 is formed on the poly-SiGe layer 93.

Figure 6:
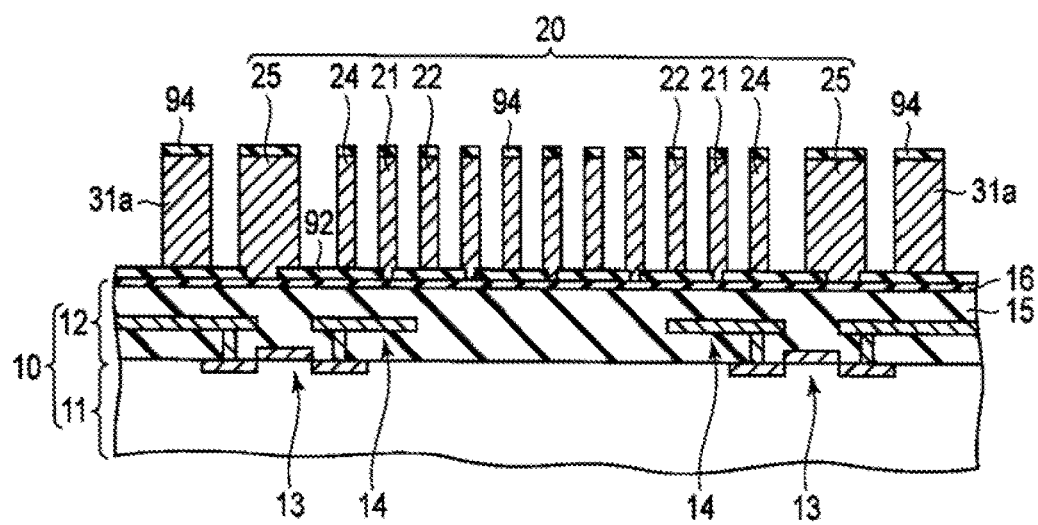
FIG. 6 is a sectional view schematically illustrating a part of the method of manufacturing the electronic device according to the first embodiment.

Subsequently, the poly-SiGe layer 93 is etched by reactive ion etching (RIE), using the silicon oxide film pattern 94 as a mask, as illustrated in FIG. 6. As a result, the fixed electrodes 21, the movable electrodes 22, the spring portions 24, the anchor portions 25, and the lower layer portion 31a of the first protective layer 31 are formed. The variable capacitor 20 includes the fixed electrodes 21, the movable electrodes 22, the spring portions 24, and the anchor portions 25.

Figure 7:
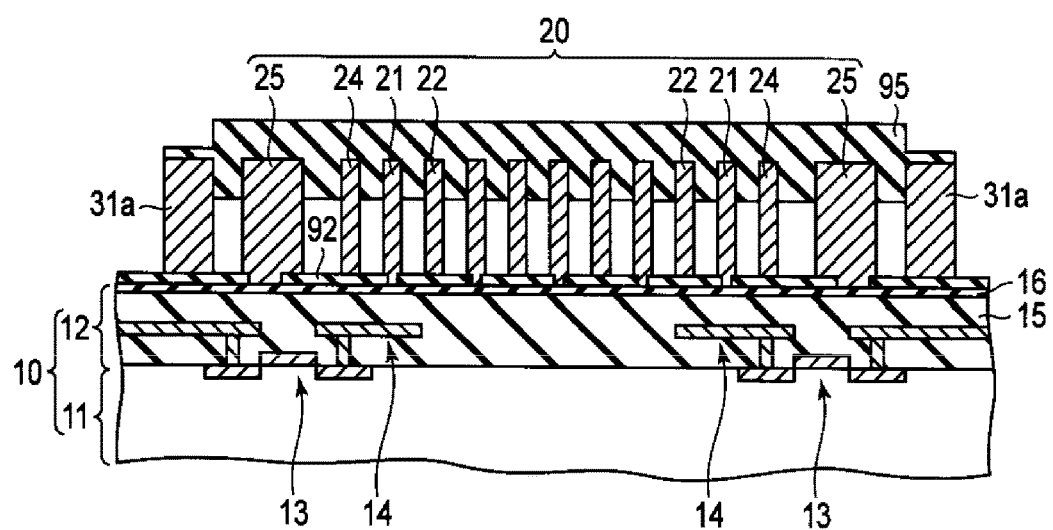
FIG. 7 is a sectional view schematically illustrating a part of the method of manufacturing the electronic device according to the first embodiment.

Subsequently, a second sacrificial layer 95 is formed to cover the fixed electrodes 21, the movable electrodes 22, the spring portions 24, the anchor portions 25, and the lower layer portion 31a of the first protective layer 31 are not formed is filled therewith, as illustrated in FIG. 7. Specifically, a silicon oxide film is used for the second sacrificial layer 95.

Figure 8:
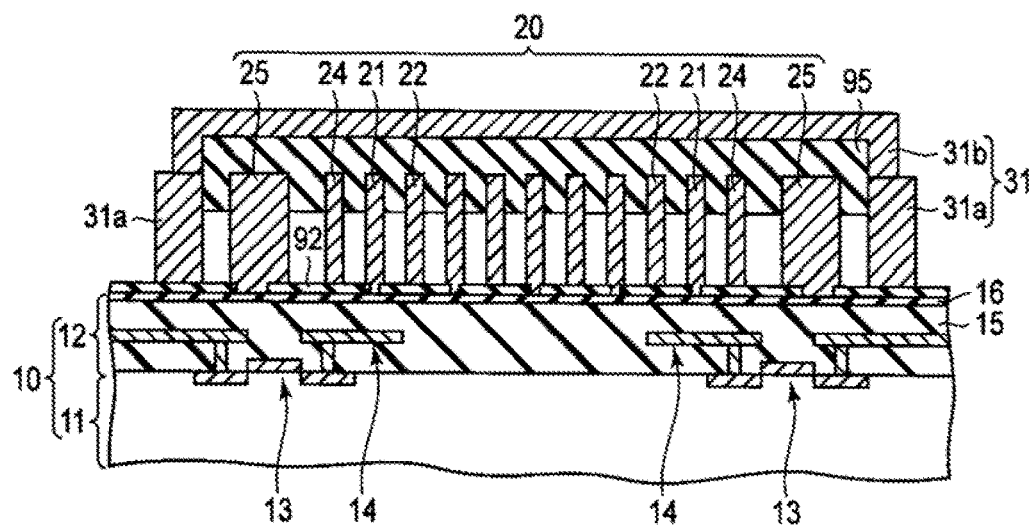
FIG. 8 is a sectional view schematically illustrating a part of the method of manufacturing the electronic device according to the first embodiment.

Subsequently, the upper layer portion 31b of the first protective layer 31 is formed on the lower layer portion 31a of the first protective layer 31 and on the second sacrificial layer 95, as illustrated in FIG. 8. Specifically, poly-SiGe is used for the upper layer portion 31b. Amorphous Si, amorphous SiC, SiN or the like may be used for the upper layer portion 31b instead of the poly-SiGe.

As described above, a structure including the variable capacitor (element portion) 20, the first protective layer 31 covering the variable capacitor 20, the first sacrificial layer 92 provided on the base region 10 (between the base region 10 and the first protective layer 31, between the base region 10 and the movable electrodes 22, and the like), and the second sacrificial layer 95 provided on the inner side of the first protective layer 31, which are formed on the base region 10, is provided.

Figure 9:
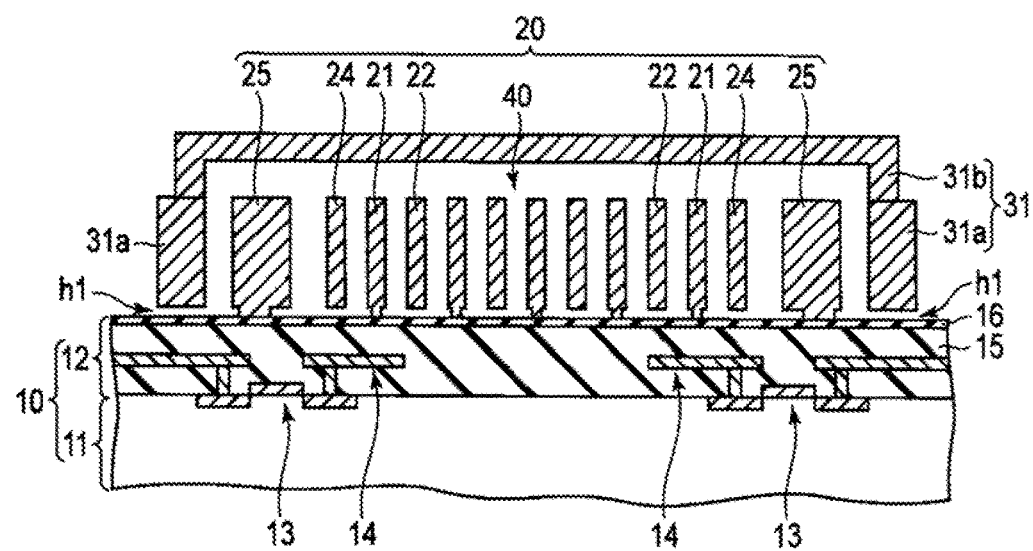
FIG. 9 is a sectional view schematically illustrating a part of the method of manufacturing the electronic device according to the first embodiment.

Subsequently, the first sacrificial layer 92 and the second sacrificial layer 95 are removed, with the result as illustrated in FIG. 9. Since both the first sacrificial layer 92 and the second sacrificial layer 95 are a silicon oxide film, the first sacrificial layer 92 and the second sacrificial layer 95 can be removed by the same etching material. By removing the first sacrificial layer 92, the holes h1 are formed and are defined by the base region 10 and the first protective layer 31, and a space is also formed between the base region 10 and the movable electrodes 22. In addition, by removing the second sacrificial layer 95, the cavity 40 is formed on the inner side of the first protective layer 31.

Thereafter, the second protective layer 32 is formed on the first protective layer 31, as illustrated in FIG. 1. The holes h1 provided in the first protective layer 31 are covered by the second protective layer 32.

As described above, in the present embodiment, the holes h1 are formed on the inner side of the first protective layer 31 by removing the first sacrificial layer 92 formed between the base region 10 and the first protective layer 31. Therefore, the size (height of the hole h1) of the hole h1 is defined by a thickness of the first sacrificial layer 92, and a minute hole h1 having a small area and a narrow width can be obtained. In a case where a hole for removing the second sacrificial layer is not formed through the side surface of the first protective layer 31 but instead formed through an upper surface of the first protective layer 31, the hole needs to be formed by patterning (Lithography of a resist), and a minute hole with a small area is difficult to form. In the present embodiment, as described above, it is possible to form the minute hole h1 having a small cross-sectional area and a narrow width in particular in a side surface of the first protective layer 31. Therefore, when the holes h1 are sealed by the second protective layer 32, high vacuum sealing can be performed by a small amount of sealing material, and thus, an electronic device with high performance can be obtained by using a MEMS technology.

In addition, in the present embodiment, multiple holes h1 are provided extending through the side surface of the first protective layer 31, and thus, etching products can be easily removed from the inner side of the first protective layer 31, when the first sacrificial layer 92 and the second sacrificial layer 95 are removed by etching. In addition, the multiple holes h1 provided relieve stress of the first protective layer 31, and increase the strength of the first protective layer 31.

Figure 10:
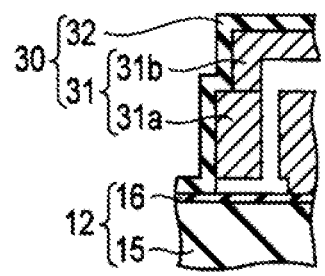
FIG. 10 is a sectional view schematically illustrating a first configuration example according to the first embodiment, when a hole is sealed by a second protective layer.

FIG. 10 is a sectional view schematically illustrating a first configuration example of the hole h1 sealed by the second protective layer 32. For example, in a case where the second protective layer 32 is formed by sputtering, the second protective layer 32 is not formed inwardly of the holes h1, as illustrated in FIG. 10. In a case where the second protective layer 32 is formed by sputtering, Si, SiGe, SiC, SiO$_2$, SiN, or the like can be used as a material of the second protective layer 32.

Figure 11:
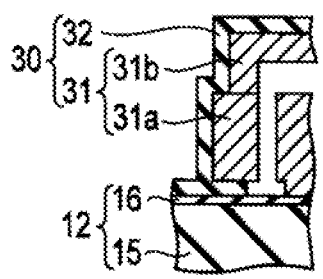
FIG. 11 is a sectional view schematically illustrating a second configuration example according to the first embodiment, when a hole is sealed by a second protective layer.

FIG. 11 is a sectional view schematically illustrating a second configuration example, when the hole h1 is sealed by the second protective layer 32. For example, in a case where the second protective layer 32 is formed by reflowing the material of the second protective layer 32 after the depositing thereof on the first protective layer 31, the second protective layer 32 is also formed inwardly of the holes h1, as illustrated in FIG. 11. In a case where the second protective layer 32 is formed by reflowing, sputtered Cu, Al, Ti, or the like can be used as a material of the second protective layer 32.

Figure 12:
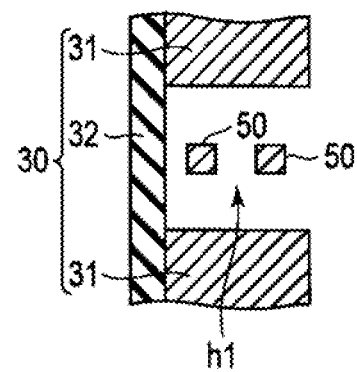
FIG. 12 is a plan view schematically illustrating a first configuration example according to the first embodiment, when a columnar portion is provided in the hole.
Figure 13:
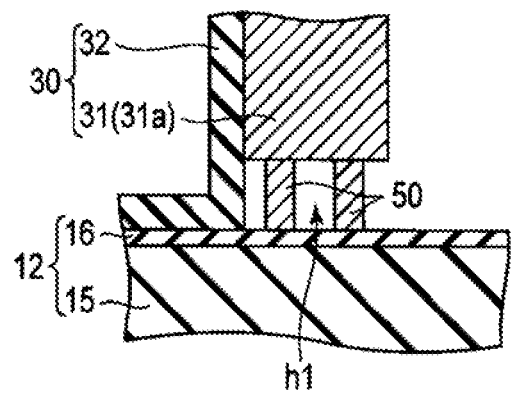
FIG. 13 is a sectional view schematically illustrating a first configuration example according to the first embodiment, when a columnar portion is provided in the hole.

FIG. 12 and FIG. 13 are views schematically illustrating a first configuration example, when a columnar portion 50 is provided on the inner side of the hole h1. FIG. 12 and FIG. 13 are a plan view and a sectional view, respectively. The columnar portion 50 is provided between a lower surface and an upper surface of the hole h1, and is in contact with the lower surface and the upper surface of the hole h1. In the present configuration example, two columnar portions 50 extend in a direction perpendicular to an inwardly extending direction of the hole h1, and spaced in the extending direction of the hole h1.

Figure 14:
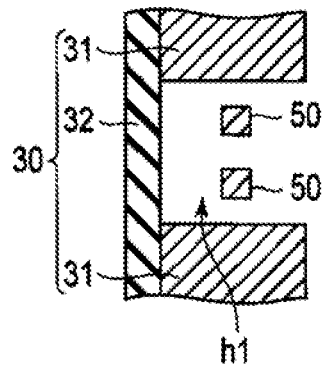
FIG. 14 is a plan view schematically illustrating a second configuration example according to the first embodiment, when a columnar portion is provided in the hole.

FIG. 14 is a plan view schematically illustrating a second configuration example, when the columnar portion 50 is provided in the hole h1. Also in the present configuration example, the columnar portion 50 is provided between the lower surface and the upper surface of the hole h1, and is in contact with the lower surface and the upper surface of the hole h1. In addition, in the present configuration example, two columnar portions 50 are spaced apart along the direction perpendicular to the extending direction of the hole h1.

As described above, the support strength of the hole h1 can be increased by providing the columnar portion 50 in the hole h1.

Figure 15:
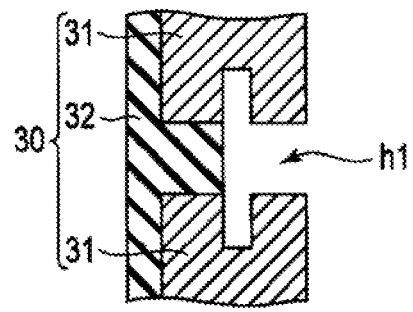
FIG. 15 is a plan view schematically illustrating a configuration of a first modification example of the hole, according to the first embodiment.
Figure 16:
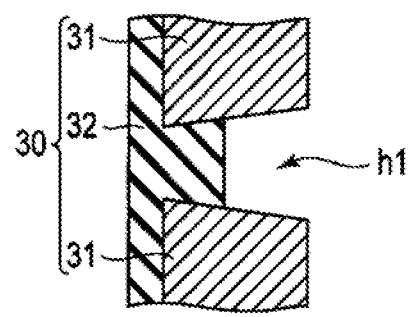
FIG. 16 is a plan view schematically illustrating a configuration of a second modification example of the hole, according to the first embodiment.
Figure 17:
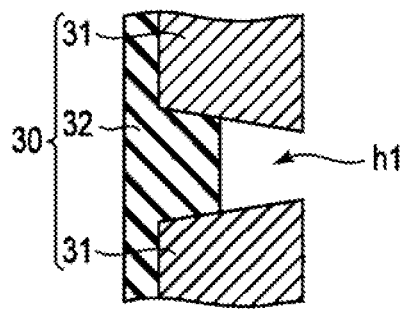
FIG. 17 is a plan view schematically illustrating a configuration of a third modification example of the hole, according to the first embodiment.

FIG. 15, FIG. 16, and FIG. 17 are plan views schematically illustrating configurations of first, second, and third modification examples of the hole h1, respectively. In the aforementioned embodiment, a shape and a size (area) of the hole h1 is constant in the extending direction of the hole h1, but at least one of the shape and the size (area) of the hole h1 changes in the extending direction of the hole h1, in the first, second, and third modification examples illustrated in FIG. 15, FIG. 16, and FIG. 17. That is, at least one of a shape and a size (area) of a cross section of the hole h1 changes in the extending direction of the hole h1.

In the first modification example of the hole h1 illustrated in FIG. 15, the shape of the hole h1 changes and the size (area) of the hole h1 increases in a central portion of the hole h1 in the extending direction of the hole inwardly of the protective layer 31. In the second modification example of the hole h1 illustrated in FIG. 16, the size (area) of the hole h1 increases toward an inner surface side of the first protective layer from an outer surface side of the first protective layer 31 (outward taper). In the third modification example of the hole h1 illustrated in FIG. 17, the size (area) of the hole h1 decreases toward the inner surface side of the first protective layer from the outer surface side of the first protective layer 31 (inward taper).

As described above, at least one of the shape and the size of the hole h1 changes in the extending direction of the hole h1, and thus, it is possible to prevent the second protective layer 32 from extending to a greater depth of the hole h1 than necessary. Particularly, in a case where the second protective layer 32 is formed by reflow, the above-described configurations of the hole h1 are effective for this purpose.

Figure 18:
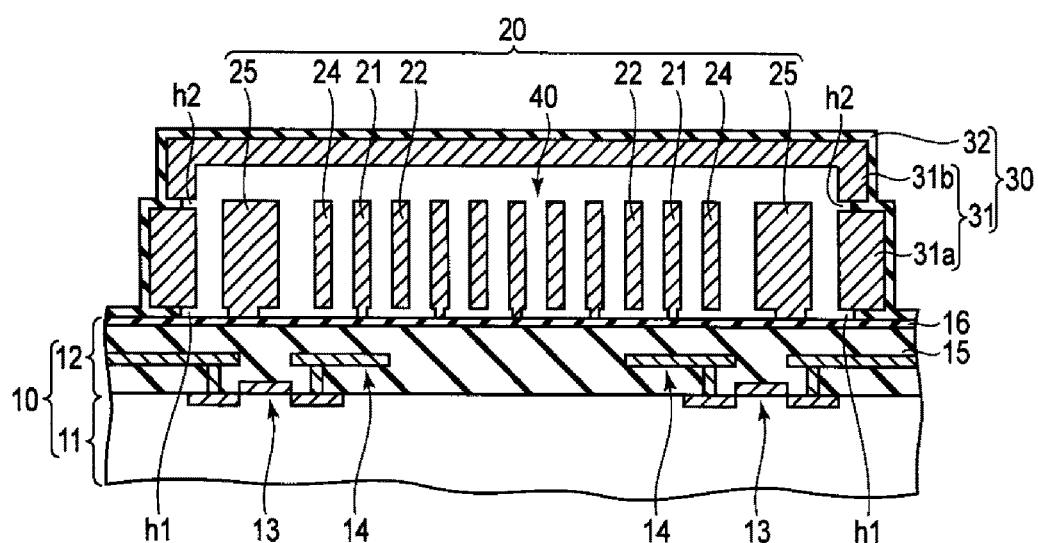
FIG. 18 is a sectional view schematically illustrating a configuration of an electronic device according to a modification example of the first embodiment.

FIG. 18 is a sectional view schematically illustrating a configuration of an electronic device according to the modification example of the first embodiment.

In the aforementioned embodiment, the hole h1 is provided between the first protective layer 31 and the base region 10, but in the present modification example, multiple holes h2 are further provided in the first protective layer 31 in addition to the holes h1. Each hole h2 extends in a direction parallel to the main surface of the base region 10. The holes h2 are provided between the lower layer portion 31a and the upper layer portion 31b of the first protective layer 31, and are surrounded by the first protective layer 31. Hence, the inner surface of the holes h2 are defined by only the first protective layer 31.

In this manner, the first sacrificial layer 92 and the second sacrificial layer 95 can be easily removed from an inner side of the first protective layer 31 by providing the holes h2 at a height different from that of the holes h1, in addition to the holes h1.

In a case where the holes h2 are provided in the first protective layer 31 as described above, the holes h1 may not be provided.

Second Embodiment

Next, an electronic device according to a second embodiment will be described. A basic configuration is the same as that of the first embodiment, and description made in the first embodiment will be omitted.

Figure 19:
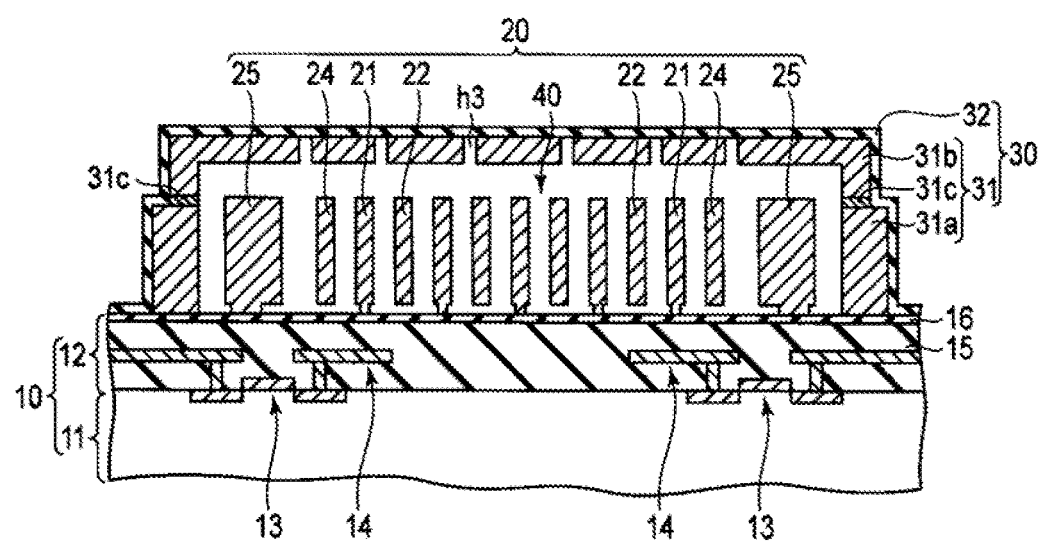
FIG. 19 is a sectional view schematically illustrating a configuration of an electronic device according to a second embodiment.

FIG. 19 is a sectional view schematically illustrating a configuration of the electronic device according to the second embodiment. The same symbols or reference numerals will be attached to the configuration elements corresponding to the configuration elements described in the first embodiment, and description thereof will be omitted.

In the present embodiment, the first protective layer 31 of the protective film 30 includes the lower layer portion 31a formed of a material containing silicon (Si) and germanium (Ge), the upper layer portion 31b formed of a material containing silicon (Si) and germanium (Ge), and an intermediate layer 31c which is interposed between the lower layer portion 31a and the upper layer portion 31b and includes at least one of a silicide layer and an amorphous metal layer. The basic configuration and material of the second protective layer 32 are the same as those of the first embodiment. In addition, the basic configurations and materials of the lower layer portion 31a and the upper layer portion 31b of the first protective layer 31 are also the same as those of the first embodiment. However, holes h3 for removing a sacrifice layer on an upper surface of the first protective layer 31 are provided in the configuration illustrated in FIG. 19.

It is preferable that a silicide layer included in the intermediate layer 31c contains at least one of silicon (Si), nickel (Ni), and cobalt (Co). The silicide layer may further contain germanium (Ge). In the present embodiment, $Ni(Si_{1-x}Ge_x)_2$ or $Co(Si_{1-x}Ge_x)_2$ is used for the silicide layer.

The amorphous metal layer included in the intermediate layer 31c contains, for example, nickel (Ni) and tantalum (Ta). In the present embodiment, amorphous NiTa is used for the amorphous metal layer.

By providing the intermediate layer 31c, it is possible to strongly connect the lower layer portion 31a to the upper layer portion 31b, and to reliably maintain an inner side of the protective film 30 to be in a high vacuum state. Hereinafter, description will be added.

As can be seen from the description of the first embodiment, the lower layer portion 31a of the first protective layer 31 is formed by a process different from the upper layer portion 31b, and thus, there is a possibility that adhesiveness between the lower layer portion 31a and an upper layer portion 31b is insufficient. Therefore, there is a possibility that a high vacuum state on the inner side of the protective film 30 may not be maintained.

In the present embodiment, the intermediate layer 31c including at least one of the silicide layer and the amorphous metal layer is provided between the lower layer portion 31a and the upper layer portion 31b, and thus, it is possible to prevent the aforementioned problem from occurring.

A case where the intermediate layer 31c includes the silicide layer will be described. Silicide, that is, Ni silicide and Co silicide have a lattice constant that is similar to the lattice constant of SiGe. Therefore, by providing the intermediate layer 31c including the aforementioned silicide layer between the lower layer portion 31a formed of SiGe and the upper layer portion 31b formed of SiGe, it is possible to reduce the lattice constant difference between the lower layer portion 31a and the intermediate layer 31c, and the lattice constant difference between the upper layer portion 31b and the intermediate layer 31c, and to effectively connect the lower layer portion 31a to the upper layer portion 31b.

A case where the intermediate layer 31c includes the amorphous metal layer will be described. SiGe which is used for the lower layer portion 31a and the upper layer portion 31b is crystalline. Therefore, when the intermediate layer 31c is crystalline and has a lattice constant greatly different from a lattice constant of SiGe, the lower layer portion 31a is difficult to be effectively connected to the upper layer portion 31b by the intermediate layer 31c. The amorphous metal layer is not crystalline, and thus, the aforementioned problem does not occur, and the lower layer portion 31a can be effectively connected to the upper layer portion 31b by the intermediate layer 31c.

Figure 20:
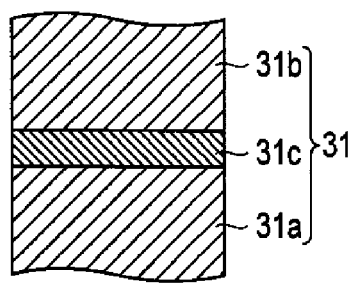
FIG. 20 is a sectional view schematically illustrating a first configuration example of a first protective layer, according to the second embodiment.

FIG. 20 is a sectional view schematically illustrating a first configuration example of the first protective layer 31 (particularly, the intermediate layer 31c). In the present configuration example, the intermediate layer 31c is a single layer. That is, in the present configuration example, the intermediate layer 31c is formed of any one of the aforementioned silicide layer and the aforementioned amorphous metal layer.

Figure 21:
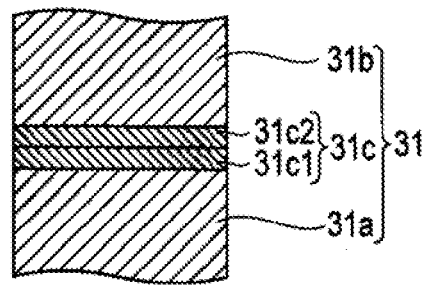
FIG. 21 is a sectional view schematically illustrating a second configuration example of the first protective layer, according to the second embodiment.

FIG. 21 is a sectional view schematically illustrating a second configuration example of the first protective layer 31 (particularly, the intermediate layer 31c). In the present configuration example, the intermediate layer 31c includes two layers 31c1 and 31c2. That is, in the present configuration example, the intermediate layer 31c is formed of two layers of the aforementioned silicide layer and the aforementioned amorphous metal layer.

Figure 22:
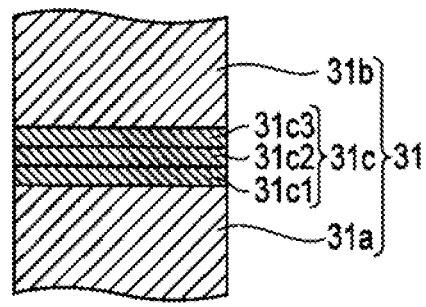
FIG. 22 is a sectional view schematically illustrating a third configuration example of the first protective layer, according to the second embodiment.

FIG. 22 is a sectional view schematically illustrating a third configuration example of the first protective layer 31 (particularly, the intermediate layer 31c). In the present configuration example, the intermediate layer 31c includes three layers 31c1, 31c2, and 31c3. Specifically, a layer 31c2 formed of the aforementioned amorphous metal layer is provided between the layers 31c1 and 31c3 which are formed of the aforementioned silicide layer. In addition, the layer 31c2 formed of the aforementioned silicide layer is provided between the layers 31c1 and 31c3 which are formed of the aforementioned amorphous metal layer.

The number of layers of the silicide layer included in the intermediate layer 31c, and the number of the amorphous metal layers included in the intermediate layer 31c may be further increased.

As described above, according to the present embodiments, the intermediate layer 31c including at least one of the silicide layer and the amorphous metal layer is provided between the lower layer portion 31a and the upper layer portion 31b of the first protective layer 31, and thus, the lower layer portion 31a can be strongly connected to the upper layer portion 31b by the intermediate layer 31c, and a high vacuum state on an inner side of the protective film 30 can be reliably maintained.

Figure 23:
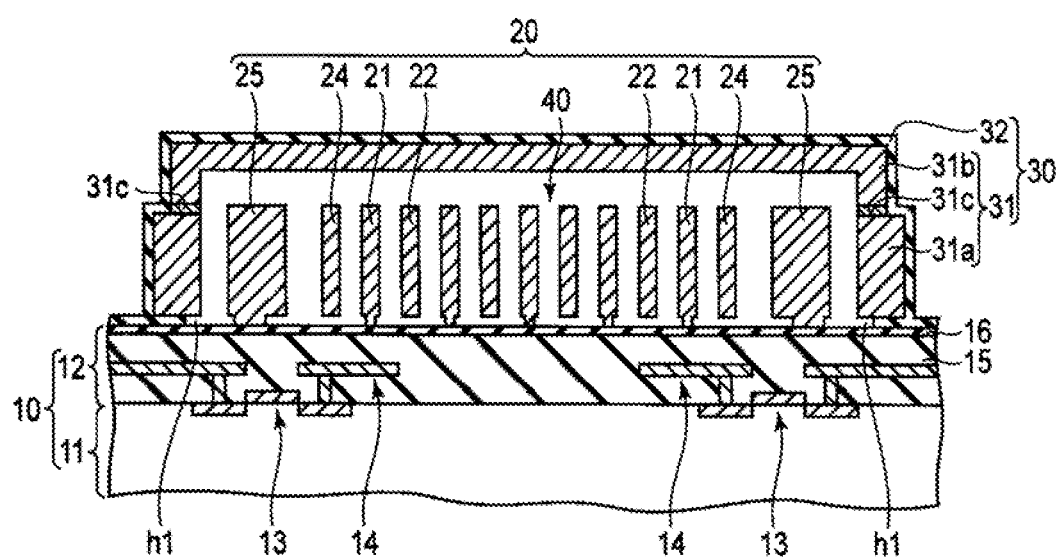
FIG. 23 is a sectional view schematically illustrating a configuration of an electronic device according to a modification example of the second embodiment.

FIG. 23 is a sectional view schematically illustrating a configuration of an electronic device according to a modification example of the second embodiment. In the configuration (configuration illustrated in FIG. 19) of the aforementioned embodiment, the holes h3 for removing the sacrificial layer are provided in the upper surface of the first protective layer 31. However, in the modification example illustrated in FIG. 23, the holes h1 for removing the sacrificial layer are provided in the side surface of the first protective layer 31 in the same manner as the first embodiment. That is, also in the present embodiment, a hole which is the same as the hole described in the first embodiment may be provided so as to remove the sacrificial layer.

Both the effects which are obtained by the first embodiment and the effects which are obtained by the second embodiment can be obtained by employing the aforementioned configurations.

In the aforementioned embodiments, the variable capacitor is employed as the element portion having the movable portion. However, an element other than the variable capacitor can also be employed, if the element includes a movable portion and is formed by using the MEMS technology.

Hereinafter, appendices will be provided to the aforementioned embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
  a base region having a surface;
  an element portion located on the base region, the element portion including a movable portion; and
  a protective film covering the element portion and forming a cavity on an inner side of the protective film between the protective film and the element portion,
  wherein the protective film includes:
    a first protective layer,
    a hole extending through the first protective layer in a direction parallel to the surface of the base region, at least one of a shape and a size of the hole being changed in an extending direction of the hole, and
    a second protective layer overlying the first protective layer and covering the hole.

2. The electronic device according to claim 1, wherein the hole is located between the surface of the base region and the first protective layer.

3. The electronic device according to claim 1, wherein the hole is spaced from the surface of the base region.

4. The electronic device according to claim 1, further including at least a second hole extending in a direction parallel to the surface of the base region.

5. The electronic device according to claim 4, wherein the second hole is located between the surface of the base region and the first protective layer.

6. The electronic device according to claim 4, wherein the second hole is spaced from the surface of the base region.

7. The electronic device according to claim 6, wherein the second hole extends through the first protective layer.

8. The electronic device according to claim 1, further comprising a columnar portion extending across an inner surface of the hole.

9. The electronic device according to claim 1, wherein shape and the size of the hole increases in a central portion of the hole inwardly of the protective layer.

10. An electronic device comprising:
  a base region;
  an element portion located on the base region, the element portion including a movable portion; and
  a protective film overlying the element portion and forming a cavity on an inner side of the protective film facing the element portion,
  wherein the protective film includes a first protective layer and a second protective layer on the first protective layer, a hole extending between the inner surface of the first protective layer and the outer surface of the first protective layer, wherein the second protective layer covers the hole, at least one of a shape and a size of the hole being changed in an extending direction of the hole, and
  wherein an inner surface of the hole comprises, at least in part, the first protective layer.

11. The electronic device according to claim 10, wherein the first protective layer comprises a lower sub-layer containing silicon (Si) and germanium (Ge), an upper sub-layer containing silicon (Si) and germanium (Ge), and an intermediate sub-layer interposed between the lower sub-layer and the upper sub-layer containing at least one of a silicide layer and an amorphous metal layer.

12. The electronic device according to claim 10, wherein the hole is spaced from the surface of the base region.

13. The electronic device according to claim 10, wherein the hole extends in a direction parallel to the surface of the base region.

14. The electronic device according to claim 10, wherein the hole extends in a direction perpendicular to the surface of the base region.

15. The electronic device according to claim 10, wherein the shape and the size of the hole increases in a central portion of the hole inwardly of the protective layer.

16. An electronic device comprising:
  a base region;
  an element portion located on the base region, the element portion including a movable portion;
  a protective film overlying the element portion and forming a cavity on an inner side of the protective film facing the element portion; and
  a columnar portion extending between a lower surface and an upper surface of the hole,
  wherein the protective film includes a first protective layer and a second protective layer on the first protective layer, a hole extending between the inner surface of the first protective layer and the outer surface of the first protective layer, wherein the second protective layer covers the hole, and
  wherein an inner surface of the hole comprises, at least in part, the first protective layer.

* * * * *